US005627111A

United States Patent [19]

Tsukamoto et al.

[11] Patent Number: 5,627,111

[45] Date of Patent: May 6, 1997

[54] ELECTRON EMITTING DEVICE AND PROCESS FOR PRODUCING THE SAME

[75] Inventors: Takeo Tsukamoto, Atsugi; Akira Shimizu, Sagamihara; Akira Suzuki; Masao Sugata, both of Yokohama; Isamu Shimoda, Zama; Masahiko Okunuki, Tokyo, all of Japan

[73] Assignee: Canon Kabushiki Kaisha, Tokyo, Japan

[21] Appl. No.: 472,111

[22] Filed: Jun. 7, 1995

Related U.S. Application Data

[62] Division of Ser. No. 418,091, Apr. 6, 1995, Pat. No. 5,559,342, which is a continuation of Ser. No. 213,512, Mar. 16, 1994, abandoned, which is a division of Ser. No. 874,218, Apr. 27, 1992, Pat. No. 5,327,050, which is a continuation of Ser. No. 525,314, May 21, 1990, abandoned, which is a continuation of Ser. No. 370,125, Jun. 20, 1989, abandoned, which is a continuation of Ser. No. 69,215, Jul. 2, 1987, abandoned.

[30] Foreign Application Priority Data

| | | | |
|---|---|---|---|
| Jul. 4, 1986 | [JP] | Japan | 61-156265 |
| Sep. 9, 1986 | [JP] | Japan | 61-210588 |

[51] Int. Cl.$^{6}$ .................... H01L 21/465

[52] U.S. Cl. .................... 438/20; 427/77; 445/24; 445/51; 313/309; 313/310; 313/311

[58] Field of Search .................... 437/101, 228 CR; 148/DIG. 1; 313/309, 310, 311, 346 R, 351, 355; 427/77; 445/24, 51

[56] References Cited

U.S. PATENT DOCUMENTS

| | | | |
|---|---|---|---|
| 3,936,329 | 2/1976 | Kendall et al. | 437/228 CR |
| 3,990,914 | 11/1976 | Weinstein et al. | 437/3 |
| 4,599,076 | 7/1986 | Yokono et al. | 313/355 |

*Primary Examiner*—John Niebling
*Assistant Examiner*—Brian K. Dutton
*Attorney, Agent, or Firm*—Fitzpatrick, Cella, Harper & Scinto

[57] ABSTRACT

An electron emitting device causes electron emission by a current supply in a coarse resistor film. The coarse thin resistor film is composed at least of a coarse thin silicon film.

6 Claims, 6 Drawing Sheets

ELECTRON EMITTING DEVICE AND PROCESS FOR PRODUCING THE SAME

This application is a division of application Ser. No. 08/418,091 filed Apr. 6, 1995, which issued as U.S. Pat. No. 5,559,342 and is a continuation of application Ser. No. 08/213,521, filed Mar. 16, 1994, abandoned, which is a divisional application of Ser. No. 07/874,218, filed Apr. 27, 1992, which issued as U.S. Pat. 5,327,050 and is a continuation of application Ser. No. 07/525,314, filed May 21, 1990, abandoned, which is a continuation of application Ser. No. 07/370,125, filed Jun. 20, 1989, abandoned, which is a continuation of application Ser. No. 07/069,215, filed Jul. 2, 1987, abandoned.

BACKGROUND OF THE INVENTION

1. Field of the Invention

The present invention relates to a so-called surface conduction electron emitting device, for causing electron emission by supplying a current to a coarse resistor film, and a process for producing the same.

2. Related Background Art

A surface conduction electron emitting device is provided with a coarse resistor film in which the film-constituting material is discontinuous as an island structure or has defects, and emits electrons by supplying a current to such resistor film.

Conventionally such coarse resistor film has been obtained by forming, on a insulating substrate, a thin film of metal, metal oxide or semi-metal by chemical vapor deposition or sputtering, and applying a current to thus formed film of several ohms to several hundred ohms to cause local destructions of the film by Joule's heat, thereby obtaining a resistance of several kilo-ohms to several hundred megohms.

However, because of such forming process, the electron-emitting device cannot be formed on another semiconductor device but has to be formed as a separate device. The manufacturing process is therefore inevitably complex, and it has been difficult to achieve compactization through integration with a driving circuit.

Besides, in the conventional coarse resistor film utilizing metal, metal oxide or semi-metal, the quantity of electron emission is increased by forming, on the surface of said film, a layer of a material for reducing the work function such as a Cs or CsO layer, stable electron emission cannot be expected since the alkali metal such as cesium is unstable.

Such unstability can be prevented by forming a silicide of such alkali metal, but the formation of a silicide or oxide layer on the conventional thin film of metal, metal oxide or semi-metal complicates the manufacturing process.

Also such conventional forming process is unstable, so that the produced electron emitting devices show fluctuation in the efficiency of electron emission and are associated with a short service life.

SUMMARY OF THE INVENTION

An object of the present invention is to provide an electron emitting device not associated with the above-mentioned drawbacks associated with the prior technology.

Another object of the present invention is to provide an electron emitting device allowing easy manufacture and compactization, through the use of a coarse silicon thin film as the resistor film for electron emission by current supply.

In an embodiment of the present invention, said coarse silicon thin film is formed by local crystallization of silicon in another material such as aluminum.

Still another object of the present invention is to provide an electron emitting device provided with a high electron emission efficiency, a limited device-to-device fluctuation of the characteristics, and a long service life.

DESCRIPTION OF THE PREFERRED EMBODIMENTS

Figure 1A:
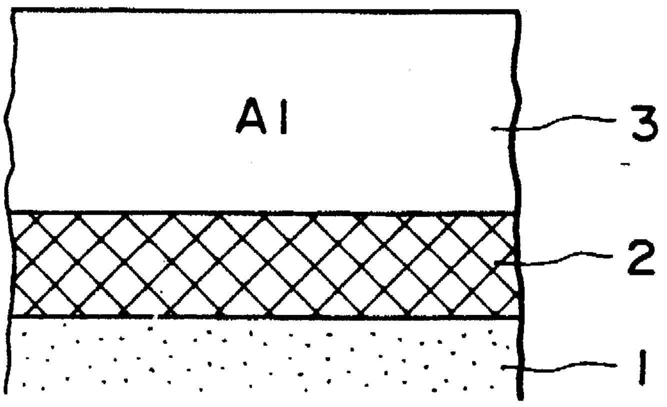
FIGS. 1A and 1B are schematic views showing local crystallization of silicon.
Figure 1B:
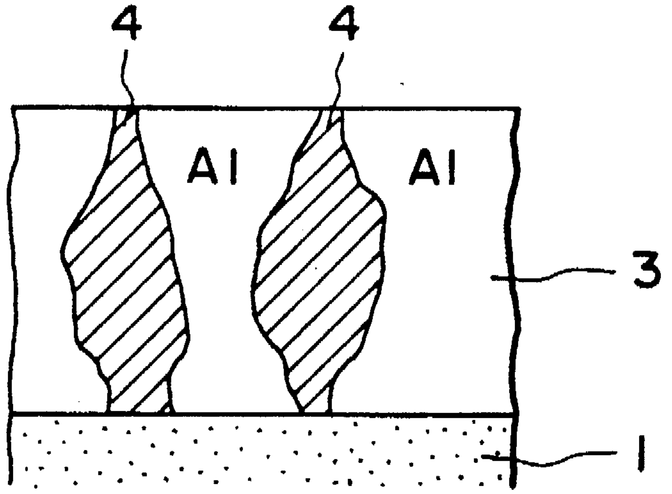

FIGS. 1A and 1B are schematic views for explaining the phenomenon of local crystallization of silicon.

At first, as shown in FIG. 1A, a polycrystalline silicon layer 2 is formed on an insulating substrate 1 such as of $SiO_2$, and an aluminum layer 3 thicker than said polycrystalline silicon layer 2 is formed thereon.

Subsequently a heat treatment is conducted in this state whereby silicon locally crystallizes upwards in the aluminum layer 3 from the polycrystalline silicon layer 2, thereby forming local silicon areas 4 in the aluminum layer 3, as shown in FIG. 1B. The thickness of the aluminum layer 3 has to be larger than that of the polycrystalline silicon layer 2 for the formation of such silicon areas 4. For further explanation of the phenomenon, reference is to be made to "Interaction of Al layers with polycrystalline Si (Nakamura et al., Journal of Applied Physics, Vol. 46, No. 11, November 1975)".

Once such local silicon areas 4 are formed, a coarse thin silicon film usable as the base of a coarse resistor film can be obtained by chemical elimination of aluminum alone. Therefore a coarse thin film can be obtained with satisfactory reproducibility, by selecting two parameters of the temperature of heat treatment and thickness of aluminum layer, without the conventional forming process.

Also an electron emitting device can be formed even on a semiconductor device, since the coarse thin resistor film can be formed without the forming process on a silicon wafer or on an insulating layer.

Furthermore the coarse thin silicon film facilitates the formation of silicide or oxide of the material for reducing the work function, such as alkali metal, thereby easily achieving stable electron emission.

Furthermore the coarse thin silicon film allows easy adjustment of resistance through the control of impurity concentration in silicon.

In the following the present invention will be clarified in detail by embodiments thereof shown in the appended drawings.

Figure 2A:
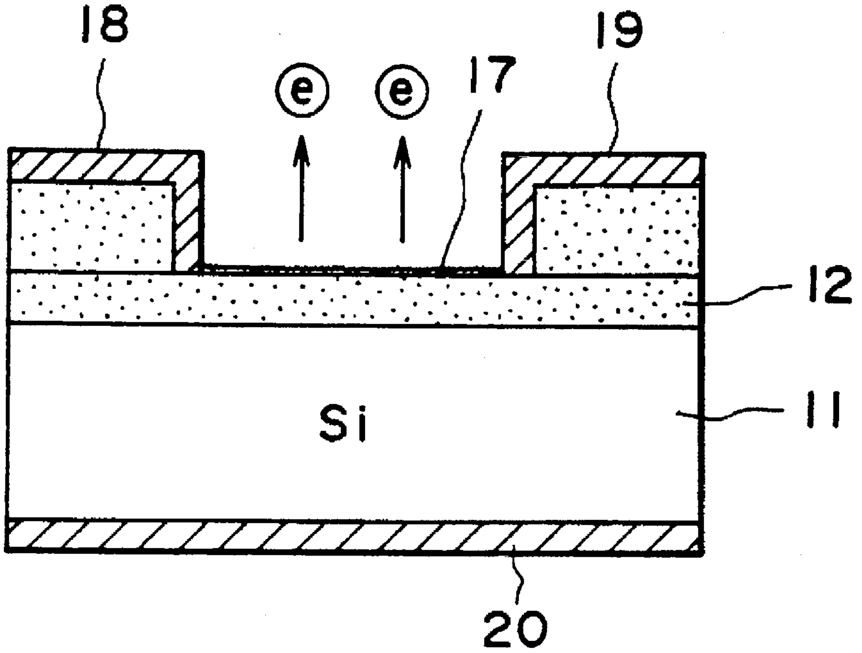
FIG. 2A is a schematic cross-sectional view of the electron emitting device embodying the present invention.
Figure 2B:
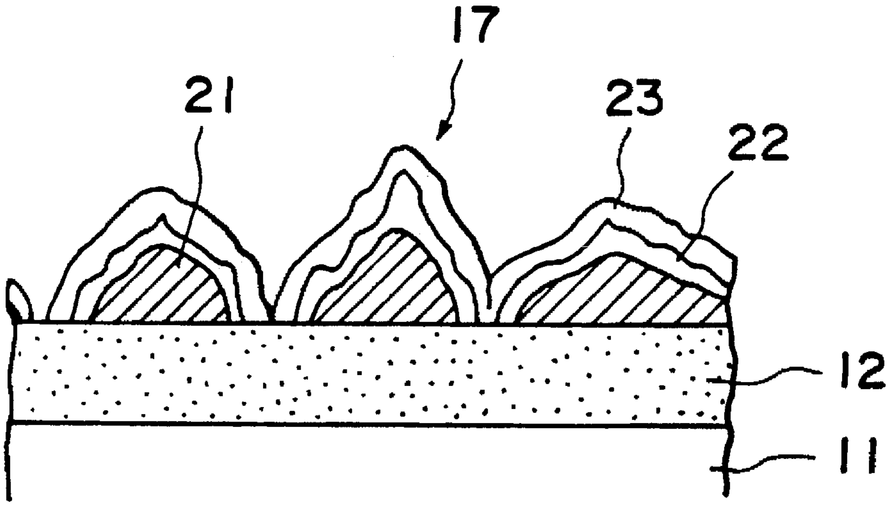
FIG. 2B is a magnified cross-sectional view of a resistor film thereof.

FIG. 2A is a schematic cross-sectional view of the electron emitting device embodying the present invention, and FIG. 2B is a magnified cross-sectional view of the resistor film thereof.

On a silicon substrate 11, a $SiO_2$ layer 12 is formed by oxidation or chemical vapor deposition, and, in a desired position on said layer, there is formed a coarse thin resistor layer 17 by a process to be explained later. Subsequently formed are electrodes 18, 19 connected to the ends of the thin resistor film 17 and an electrode 20 on the rear side of the substrate 11.

As shown in FIG. 2B, the coarse thin resistor film 17 is composed of a coarse thin silicon film 21 provided, at the surface thereof, with a $CsSi_3$ layer 22 and a CsO layer 23, which serve to reduce the work function, thus increasing the quantity of electron emission. Also stable electron emission can be achieved since cesium is present in the states of silicide and oxide.

In the above-explained embodiment, electrons are efficiently and stably emitted by applying an AC (or DC) voltage across the electrodes 18, 19 and applying a voltage across the electrode 20 and the electrodes 18, 19 in such a manner that the latter assumes a higher potential.

Figure 3A:
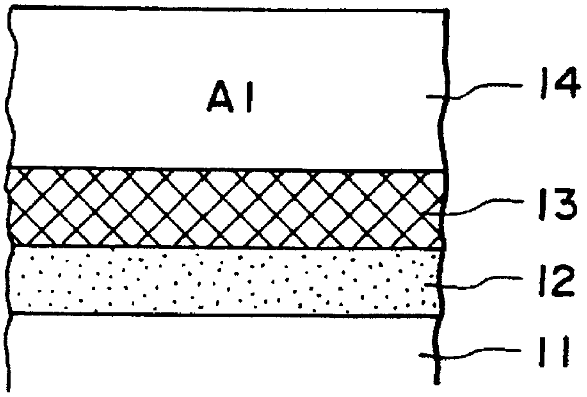
FIGS. 3A to 3C are schematic views showing an embodiment of process steps for producing the electron emitting device of the present invention.
Figure 3B:
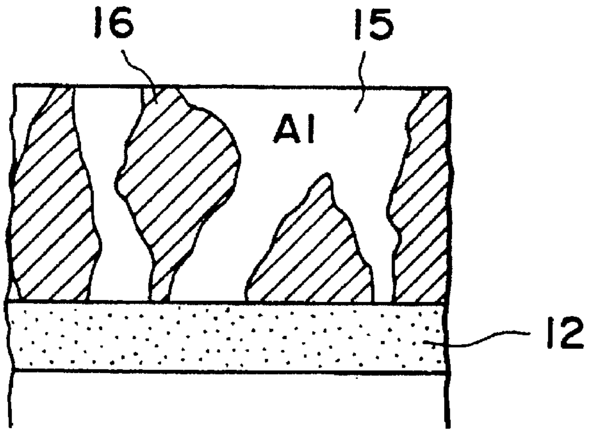
Figure 3C:
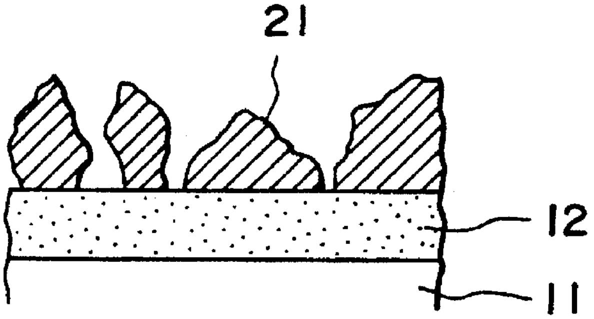

FIGS. 3A to 3C are schematic views illustrating an embodiment of the process steps for producing the electron emitting device of the present invention.

At first, as shown in FIG. 3A, the $SiO_2$ layer 12 is formed by oxidation or chemical vapor deposition on the silicon substrate 11. Then a polycrystalline silicon layer 13 is formed thereon, and further formed thereon is an aluminum layer 14 of a thickness larger than that of said polycrystalline silicon layer 13. The total thickness of the polycrystalline silicon layer 13 and of the aluminum layer 14 can be selected within a range from 200 Å to 2 μm.

Subsequently said substrate 11 is heated at 500° C. or higher, whereby, as shown in FIG. 3B, silicon areas 16 crystallize locally in the aluminum area 15.

Then the aluminum area 15 are selectively removed by etching, thereby leaving a coarse thin silicon layer 21 as shown in FIG. 3C.

Subsequently cesium is deposited by evaporation on the coarse thin silicon film 21, and a heat treatment is conducted at 100°–200° C. under a pressure higher than the vapor pressure of cesium to obtain a $CsSi_3$ layer of a desired thickness. Then the surface is oxidized to form a CsO layer on the silicon film 21, across the $CsSi_3$ layer 22. In this manner a work function reducing layer consisting of the $CsSi_3$ layer and CsO layer can be easily formed on the coarse thin silicon layer 21, and obtained is a coarse thin resistor film as shown In FIG. 2B.

In the foregoing explanation cesium is employed as the work function reducing material, but there can naturally be employed other alkali metals such as Rb or alkali earth metals.

The electron emitting device of the foregoing embodiment and the producing process therefor allow to obtain a coarse thin silicon film through a simple process utilizing the local crystallization of silicon. Not requiring the conventional forming process, the coarse thin silicon film can be formed with a satisfactory reproducibility, by selecting two parameters of the temperature of heat treatment and thickness of aluminum layer.

Since the coarse thin resistor film can be formed on the silicon wafer or on the insulating layer without the forming process, the electron emitting device can be formed easily on a semiconductor device and can therefore be integrated for example with a driving circuit. It is therefore possible to easily produce a compact electron emitting apparatus.

Also the use of the coarse thin silicon film facilitates the formation of silicide and oxide of the work function reducing material such as alkali metal, thus improving and stabilizing the electron emission.

Furthermore the use of the coarse thin silicon film enables easy adjustment of resistance through the control of impurity concentration in silicon.

Furthermore it is possible to form plural units of the electron emitting device of the present invention on a wafer through an ordinary lithographic process, together with electrodes, wirings, driving circuits etc., thereby reducing external circuits and achieving compactization.

Figure 4:
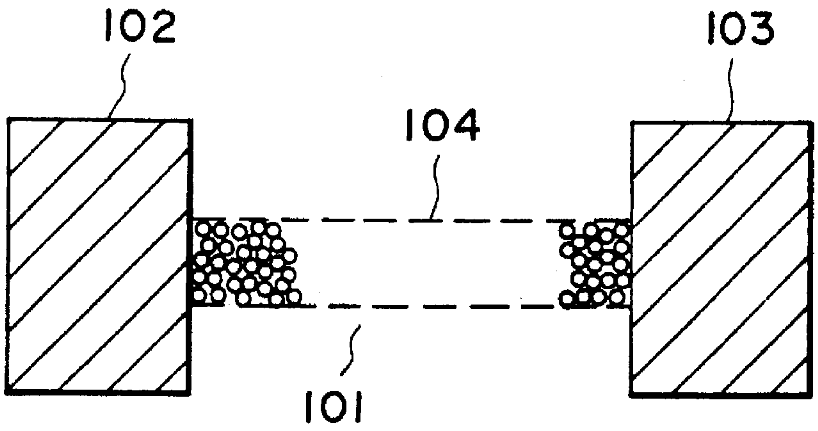
FIG. 4 is a schematic plan view of another embodiment of the electron emitting device of the present invention.

FIG. 4 is a schematic plan view of the electron emitting device constituting another embodiment of the present invention.

Referring to FIG. 4, on an insulating member 101 such as a glass plate, there are provided electrodes 102, 103 for current supply, between which formed is a coarse high resistance film 104 composed of fine particles.

Figure 5A:
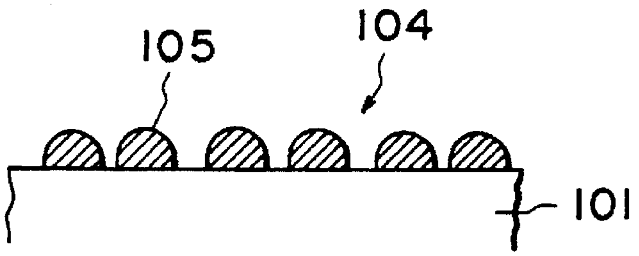
FIG. 5A is a schematic cross-sectional view of an example of the coarse high resistance film in said embodiment.
Figure 5B:
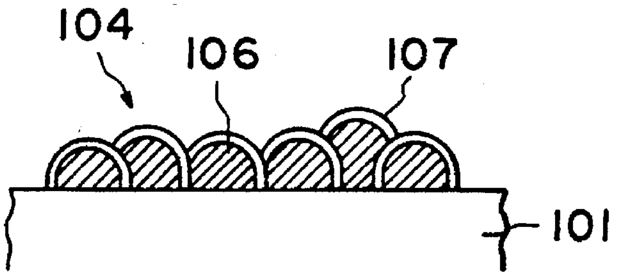
FIG. 5B is a schematic cross-sectional view of another example of the coarse high resistance film in said embodiment.

FIG. 5A is a schematic cross-sectional view of an example of the coarse high resistance film 104 in the present embodiment, and FIG. 5B is a schematic cross-sectional view showing another example of the coarse high resistance film 104 in the present embodiment.

In FIG. 5A, metal particles of a size of 0.1 to 10 μm are formed with a distance of 10–100 Å on the insulating member 101 to constitute a coarse high resistance film 104 having discontinuous areas of regular distribution in the sense that the size and gap of the particles are relatively uniform.

In FIG. 5B, metal particles 106 of a size of 0.1 to 10 μm, having a surfacial oxide layer 107 of a thickness of several to several hundred Angstroms, are formed on the insulating member 101 to constitute a coarse high resistance film 104 having discontinuous areas of regular distribution, across said oxide layers 107.

Figure 6A:
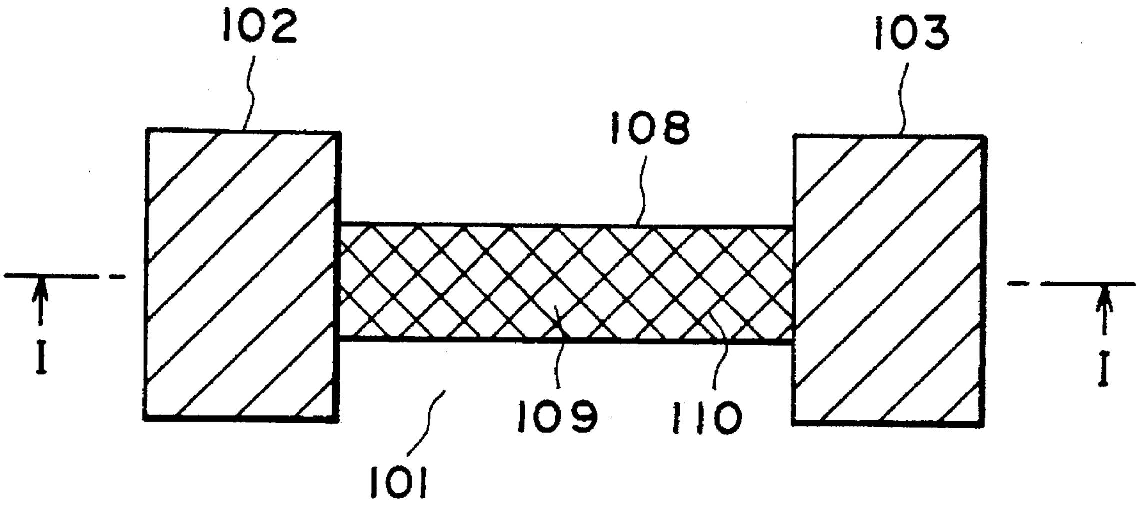
FIG. 6A is a schematic plan view of another embodiment of the present invention.
Figure 6B:
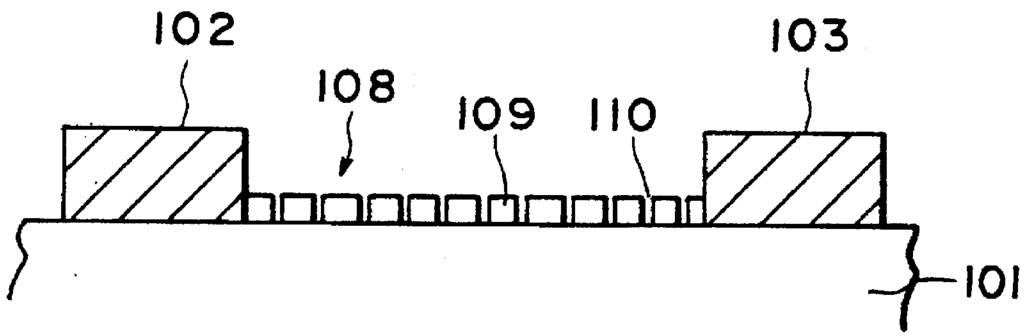
FIG. 6B is a cross-sectional view along a I—I line therein.

FIG. 6A is a schematic plan view of another embodiment of the present invention, and FIG. 6B is a cross-sectional view along a line I—I therein.

In these drawings, a coarse high resistance film 108 is obtained by forming a metal film 109 by evaporation, and forming slits 110 in a grating pattern on said film 109 With a focused ion beam, a reactive ion beam or an electron beam, thereby forming regular notches. The slits 110 are 10–5000 Å in width and 0.1~10 μm in pitch.

In comparison with the conventional process employing current supply at a high temperature, the above-explained process provides a coarse high resistance film of a stable characteristic with reduced fluctuation. Besides said film can be easily formed even when it is integrated with another semiconductor device, as the current supply at a high temperature is unnecessary.

In the following there will be explained a process for producing the coarse high resistance film 104 shown in FIG. 5B.

FIGS. 7A to 7D are schematic views showing process steps for producing the coarse high resistance film 104.

Figure 7A:
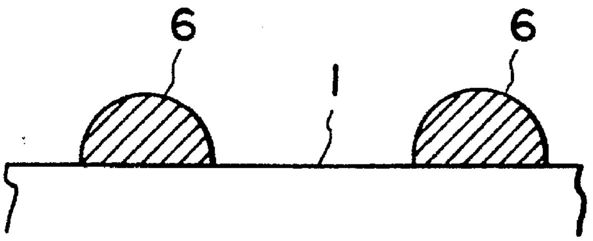
FIGS. 7A to 7D are schematic views showing process steps for producing the coarse high resistance film.

At first, as shown in FIG. 7A, metal particles of a size of 0.1–10 μm, composed of copper in this case, are deposited by ordinary evaporation on the insulating member 110 on which electrodes 102, 103 are formed in advance.

The metal particles 106 can be formed in a fine particulate structure by setting the insulating member 10 at a relatively high temperature, and the particle size can be controlled by the rate and time of evaporation, and the temperature of substrate.

The metal is not limited to Cu but can be Pb, Al or other metals.

Figure 7B:
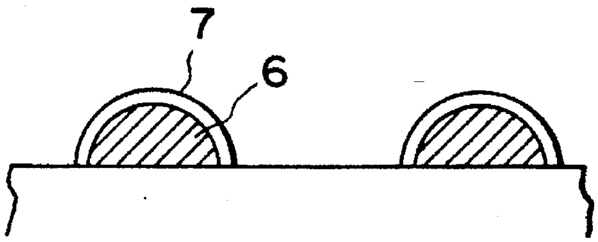

Then, as shown in FIG. 7B, the metal particles 106 are oxidized or nitrogenated to obtain a thin oxide or nitride layer 107 of a thickness of several to several hundred Angstroms on the surface of said particles.

Figure 7C:
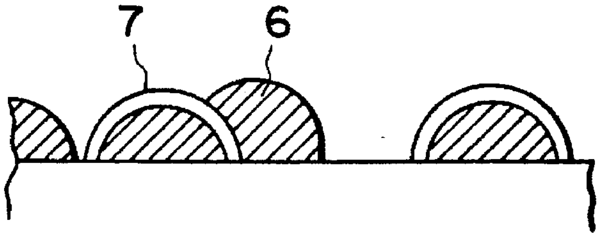
Figure 7D:
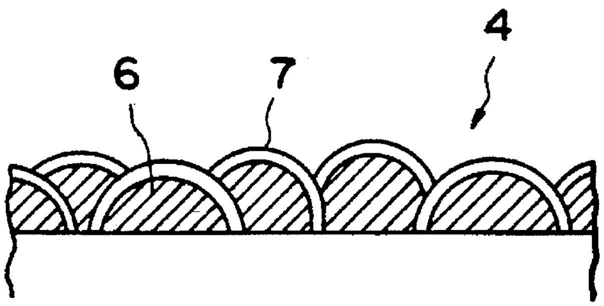

Subsequently, as shown in FIG. 7C, metal particles 106 are again deposited by ordinary evaporation and are oxidized or nitrogenated. The above-explained evaporation and oxidization are repeated by a number of desired times to obtain, as shown in FIG. 7D, a coarse high resistance film 104 in which the metal particles 106 are separated by the oxide or nitride layer 107, thus having regular discontinuous areas.

In this manner it is rendered possible to easily form a coarse high resistance film 104 in which minute and regular discontinuities are uniformly distributed. Also the stability of the process allows to provide electron emitting devices with low fluctuation in performance and with a long service life, at a high production yield.

The electron emitting device of the foregoing embodiment is optimized in structure and has an improved electron emitting efficiency, as the discontinuities are regularly distributed in the: coarse high resistance film. Also the regular formation of the film reduces the device-to-device fluctuation in case of mass production, and allows to obtain the electron emitting devices of uniform characteristic.

Also the above-explained process, not involving conventional forming process, do not contain unstable parameters and can provide electron emitting devices of a long service life and a stable characteristic.

What is claimed is:

1. A process for producing an electron emitting device provided with a resistor film composed at least of a crystalline silicon film, comprising the steps of:

forming, on a silicon layer, an aluminum layer thicker than said silicon layer;

effecting a heat treatment to cause silicon in said silicon layer to crystallize locally in said aluminum layer; and eliminating aluminum in said aluminum layer, thereby forming said crystalline silicon film.

2. The process for producing the electron emitting device according to claim 1, wherein said resistor film is obtained by forming a layer of a work function reducing material on the surface of said crystalline silicon film, then effecting a heat treatment and a surface oxidation.

3. The process for producing the electron emitting device according to claim 2, wherein said work function reducing material is an alkali metal.

4. The process for producing the electron emitting device according to claim 3 wherein said silicon layer is a polycrystalline silicon layer.

5. The process for producing the electron emitting device according to claim 2, wherein said silicon layer is a polycrystalline silicon layer.

6. The process for producing the electron emitting device according to claim 1, wherein said silicon layer is a polycrystalline silicon layer.

* * * * *

UNITED STATES PATENT AND TRADEMARK OFFICE

CERTIFICATE OF CORRECTION

PATENT NO. : 5,627,111
DATED : May 6, 1997
INVENTOR(S) : TSUKAMOTO, et al.

It is certified that error appears in the above-indentified patent and that said Letters Patent is hereby corrected as shown below:

Column 1

Line 28, "on a" should read --on an--.

Column 3

Line 42, "are" should read --is--.
Line 54, "In " should read --in--.

Column 4

Line 49, "With" should read --with--.

Column 5

Line 3, "particles 106" should read --particles 6--.
Line 4, "member 10" should read --member 101--.
Line 10, "particles 106" should read --particles 6--.
Line 12, "layer 107" should read --layer 7--.
Line 14, "particles 106" should read --particles 6--.
Line 19, "104" should read --4--, and "particles 106" should read --particles 6--.
Line 23, "film 104" should read --film 4--.
Line 32, "the:" should read --the--.

UNITED STATES PATENT AND TRADEMARK OFFICE

CERTIFICATE OF CORRECTION

PATENT NO. : 5,627,111
DATED : May 6, 1997
INVENTOR(S) : TSUKAMOTO, et al.

It is certified that error appears in the above-indentified patent and that said Letters Patent is hereby corrected as shown below:

Column 6

Line 2, "do" should read --does--.
Line 26, "claim 3" should read --claim 3,--.

Signed and Sealed this

Eleventh Day of November, 1997

Attest:

BRUCE LEHMAN

*Attesting Officer* *Commissioner of Patents and Trademarks*